United States Patent [19]

Ehman et al.

[11] 4,046,954
[45] Sept. 6, 1977

[54] MONOCRYSTALLINE SILICATES

[75] Inventors: Michael F. Ehman, Mission Viejo; Stanley B. Austerman, Villa Park, both of Calif.

[73] Assignee: Rockwell International Corporation, El Segundo, Calif.

[21] Appl. No.: 566,547

[22] Filed: Apr. 9, 1975

Related U.S. Application Data

[62] Division of Ser. No. 426,412, Dec. 19, 1973, Pat. No. 3,895,921.

[51] Int. Cl.² .............................................. B32B 9/04
[52] U.S. Cl. .................................. 428/446; 156/600; 156/617 SP; 156/622; 156/624; 428/539
[58] Field of Search ................ 428/446, 539; 156/600, 156/613, 617 SP, 617 V, 617 R, 622, 624

[56] References Cited

U.S. PATENT DOCUMENTS 3,564,358  2/1971  Hähnlein .................. 317/101 A

OTHER PUBLICATIONS

Filby et al. Single-Crystal Films of Silicon on Insulators, In Brit. J. Applied Phys. 18: pp. 1357-1382, 1967.

Primary Examiner—Cameron K. Weiffenbach
Attorney, Agent, or Firm—H. Frederick Hamann; G. Donald Weber, Jr.; Robert Ochis

[57] ABSTRACT

Single crystals consisting of various compositions from the quaternary silicate system $Al_2O_3$—CaO—MgO—$SiO_2$ are grown from the melt. The physical and chemical properties of the single crystal silicates, including akermanite ($Ca_2MgSi_2O_7$), cordierite ($Mg_2Al_4Si_5O_{18}$), and mullite ($Al_6Si_2O_{13}$), make the silicates useful, for example, as substrates for epitaxial semiconductor films.

6 Claims, 2 Drawing Figures

MONOCRYSTALLINE SILICATES

This is a division of application Ser. No. 426,412 filed Dec. 19, 1973, now U.S. Pat. No. 3,895,921.

BACKGROUND OF THE INVENTION

1. Field of the Invention

This invention relates to compositions selected from the quaternary silicate system $Al_2O_3$—CaO—MgO—$SiO_2$, to the growth of single crystal compounds from this system (hereafter termed "silicates"), and to the utilization of the single crystal silicates, including their use as substrates for epitaxial semiconductor films.

2. Description of the Prior Art

The epitaxial silicon on sapphire (SOS) technology initiated by U.S. Pat. No. 3,393,088, entitled "Epitaxial Deposition of Silicon on Alpha Aluminum", issued to H. M. Manasevit and W. I Simpson, and assigned to the common assignee, has contributed to the rapid growth of silicon semiconductor technology, particularly in the area of microelectronic circuit applications. With the development of this technology, however, there has been imposed increasingly diverse and stringent requirements regarding the physical and chemical properties of the substrate materials. In short, the achievements of silicon on substrate technology and the potential for further application of the technology require the development of additional substrate materials that are compatible with epitaxial films.

Sapphire, of course, has achieved wide acceptance as a substrate material. To date, the focus of attention has been on spinel, as well as sapphire, substrate materials. However, properties such as thermal shock susceptibility and thermal expansion impose limitations on the fabrication parameters and the operating environments of microelectronic circuitry that uses sapphire or spinel substrates. For example, as a result of thermal stability limitations, the surfaces of spinel substrates may decompose during film deposition.

The quaternary silicate system $Al_2O_3$—CaO—MgO—$SiO_2$ includes compositions that have physical and chemical properties, e.g., thermal expansion coefficients and compatibility with silicon films, that indicate the silicates would be well suited for use as substrates for silicon films and other semiconductor films if the silicates could be grown as single crystals.

The single crystal silicates are not limited to use as substrates. For example, the heat resistant qualities of mullite make it quite suitable for use in heat shields, high temperature particle filters, and so forth.

Various members of the silicate system are used in polycrystalline form, e.g., in the ceramics industry. Several techniques, such as flame fusion, have been used to grow single crystal silicates. However, none of the known techniques has proved satisfactory for the production of large, single crystal boules for device-quality substrates. Growth from the melt, which is used to grow single crystals of materials such as sapphire, has not been successfully applied to the silicates. This lack of success is perhaps due in part to conflicting data in the literature regarding whether the most widely used and best characterized silicate — mullite — is incongruently melting and, therefore, incapable of being successfully grown from the melt.

It may be appreciated that it is highly desirable to develop a technique for growing high quality, monocrystalline material from the compositional boundaries of the above-described quaternary silicate system.

SUMMARY OF THE INVENTION

A single crystal silicate is grown by (1) forming a melt containing weight percentages of the compounds $Al_2O_3$, MgO, CaO, and $SiO_2$ corresponding to the weight percentages of the particular silicate compound that is to be grown; (2) inserting a rotating seed crystal having the composition of the particular silicate compound below the surface of the melt to initiate growth thereon; and (3) forming a crystal on the seed by withdrawing the seed from the melt using predetermined translation and rotation rates.

Crystals grown in the above-described manner are monocrystalline, of device quality, and possess excellent properties, such as thermal and chemical stability, for use as substrates in semiconductor compounds.

DETAILED DESCRIPTION

As discussed previously, the literature is in conflict as to whether the silicate mullite ($Al_6Si_2O_{13}$) is incongruently melting. If mullite is incongruently melting, it would be extremely difficult to grow crystalline mullite from the melt. That is, and assuming mullite to be incongruently melting, if a mix containing proper weight percentages of constituents to form mullite is brought to the melting point, the composition decomposes into liquid and solid phases, i.e., liquid plus solid corundum. If the charge is molten and cooling is initiated, corundum will begin precipitating from the liquid at the liquidus point. The liquid will then become enriched in $SiO_2$. The precipitation process continues until the entire system is solidified. At no time will the mullite form a crystalline phase.

However, experimental work by the applicants suggested that, even if mullite is incongruently melting, chemical kinetic considerations would allow the growth of mullite from the melt. That is, the precipitation of corundum from the molten charge is very slow. Thus, by rapidly cooling the charge, the precipitation of corundum is avoided and crystalline mullite growth does occur. This finding has been applied to successfully grow single crystal mullite from the melt using a modified Czochralski growth technique. In addition, the method of growth has been shown to be applicable to other members of the quaternary silicate system $Al_2O_3$—CaO—MgO—$SiO_2$. The accompanying Table lists other members of the silicate system.

Figure 1:
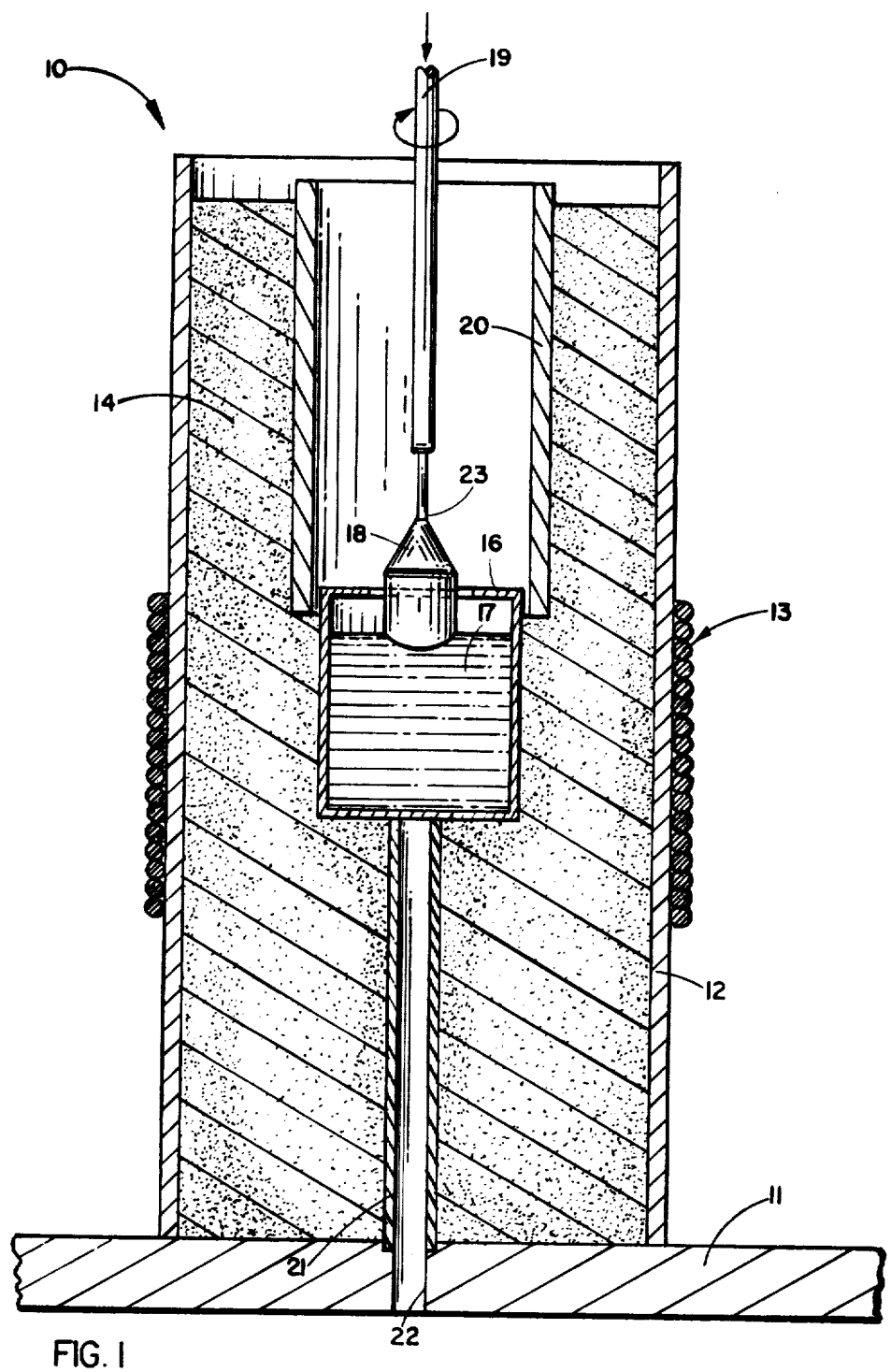
FIG. 1 is a cross-sectional representation of furnace apparatus that is suitable for growing single crystal silicate crystals in accordance with the method of the present invention.

Referring now to FIG. 1, there is shown a furnace apparatus 10 suitable for growing silicate single crystals from the melt using the method of the present invention. The furnace apparatus 10 includes a base 11 that is supported in a conventional manner and supports a tube 12 of a suitable refractory material, such as ceramic. The ceramic tube 12 is heated by an RF heating coil 13 that is actuated by a conventional power supply (not shown). The tube 12 is packed with zirconia sand 14 for supporting and insulating a crucible 16. The crucible, which is typically formed from iridium, contains a molten charge or melt 17, from which a crystal 18 is grown. The apparatus 10 also includes a crystal puller 19 that is controlled by conventional means (not shown) for both translational and rotational movement within tube 20. A small tube 21 extends downwardly from the bottom of the crucible 16 and through an aperture 22 in the base 11 so that a thermocouple (not shown) may be brought into proximity to the crucible 16 and used to control the operation of the coil power supply and, thus, effect heating the coil 13. FIG. 1 illustrates only one possible configuration of crucible support and insulation. Other arrangements could be used with equal benefit.

drawal rate of about 0.2 inches per hour and a rotational rate of about 30 rpm. At the same time, the temperature of the melt was varied, within the approximate range 1865° ± 10° C, to control the diameter of the growing crystal 18. The withdrawal was continued until the crystal was approximately 3.5 inches long by 1 inch in diameter. At this point, the rotation was stopped and the withdrawal was accelerated to about 9 inches per hour until the lower end of the crystal 18 was one half inch above the melt surface. Then, power to the RF coil 13 was shut off, allowing the furnace apparatus 10 and the crystal to cool slowly to room temperature.

The properties of the grown crystal were in excellent agreement with those published in the literature, and

| Silicate Compound | Crystal Structure | Melting Point (° C) | Hardness (Meh) | Thermal Expansion | Density (gm/cm$^3$) |
|---|---|---|---|---|---|
| Akermanite (Ca$_2$MgSi$_2$O$_7$) | Tetragonal | 1454 | 5–6 | | 2.94 |
| Cordierite (Mg$_2$Al$_4$Si$_5$O$_{18}$) | Orthorhombic | 1368 | 7–7.5 | 3.23–3.35 × 10$^{-6}$ | 2.6–2.66 |
| Fayalite (Fe$_2$SiO$_4$) | Orthorhombic | 1205 | 3.2–4.4 | 2.36 × 10$^{-6}$ | |
| Fosterite (Mg$_2$SiO$_2$) | Orthorhombic | 1890 | 6–7 | 10.6 × 10$^{-6}$ for 20–800° C | 3.21–3.33 |
| Gehlenite (Ca$_2$Al$_2$Si$_3$O$_7$) | Tetragonal | 1590 | 5–6 | | 2.9–3.1 |
| Larnite (Ca$_2$SiO$_4$) | Monoclinic | ~2125 | | | 3.28 |
| Merwinite (Ca$_3$MgSi$_2$O$_8$) | Monoclinic | ~1680 | 6 | | 3.15–3.31 |
| Monticellite (CaMgSiO$_4$) | Orthorhombic | ~1405 | 5 | | 3.2 |
| Sapphirine (Mg$_5$Al$_{12}$Si$_2$O$_{27}$) | Monoclinic | ~1450 | 7.5 | | 3.4–3.5 |
| Mullite (Al$_6$Si$_2$O$_{13}$) | Orthorhombic | ~1860 | 6.7 | | 3.15–3.26 |

Properties of Silicates of the System Al$_2$O$_3$-CaO-MgO-SiO$_2$

The method of growing single crystal silicate compounds from the melt comprises the steps of (1) forming a melt 17 consisting of the compounds Al$_2$O$_3$, CaO, MgO, and SiO$_2$ in weight percentages corresponding to those of the desired crystalline composition, the melt being formed within the crucible 16 and at a temperature just above the melting point of the composition: (2) raising the temperature of the melt to the extent necessary to provide a homogeneous melt; (3) inserting at least a portion of a seed crystal into the melt to initiate growth of the silicate crystal; (4) pulling the seed crystal from the melt at predetermined translational and rotational rates, while controlling the temperature of the melt, to grow a crystal 18 of predetermined length and diameter; (5) pulling the crystal from the melt at an increased rate; and (6) cooling the crystal and melt to room temperature.

Application of the above-described method is illustrated by the following examples:

EXAMPLE 1

Mullite (Al$_6$Si$_2$O$_{13}$)

A charge comprising 71.795 weight percent Al$_2$O$_3$ and 28.205 weight percent SiO$_2$ was melted in the iridium crucible 16 at the 1860° C melting point of mullite, then elevated to about 1865° C to provide a homogeneous melt 17. A mullite seed crystal affixed to a lower end 23 of the crystal puller 19 was then lowered to a position just below the melt surface using crystal puller rotation of about 30 rpm.

Upon initiation of mullite single crystal growth on the seed crystal as a result of the temperature differential between the seed crystal and the melt 17, the seed was slowly pulled from the melt, using a crystal puller with-shown in the Table. That is, the mullite crystal was orthorhombic (with lattice constants, in Angstroms, of $a = 7.55$, $b = 7.69$, and $c = 2.90$); hardness was 7 Mohs; and the thermal expansion coefficient was 5.0 × 10$^{-6}$.

Although the melt used in the present example was stoichiometric, single crystals have also been grown from non-stoichiometric melts.

EXAMPLE 2

Akermanite (Ca$_2$MgSi$_2$O$_7$)

A charge consisting of CaO, MgO, and SiO$_2$ in the respective weight percentages 41.13, 14.79, and 44.08 was melted in the iridium crucible 16 at the 1454° C melting point of akermanite. The temperature of the melt 17 was then raised about 70° to 1525° C. With the crystal puller 19 rotating at about 18 rpm, a seed crystal affixed to the lower end 23 thereof was lowered to a position slightly below the surface of the melt to initiate growth of the akermanite crystal 18 from the melt onto the slightly cooler seed crystal. As the crystal began to grow, the seed was withdrawn from the melt at a rate of 0.2 inches per hour, using a rotation rate of about 18 rpm, and varying the temperature of the melt within the approximate range 1525° ± 20° C to control the diameter of the growing crystal. The growth conditions were maintained for 20 hours until the crystal was 4.0 inches long by 0.5 inches in diameter. At this point the rotation was stopped and the withdrawal of the crystal from the melt was accelerated to about 8⅝ inches per hour and continued until the bottom of the grown crystal was approximately ½ inch above the melt surface. Then, the furnace apparatus 10 and the crystal were allowed to cool to room temperature.

The resulting crystal was determined to possess a tetragonal crystal structure (with lattice constants $a = 7.8$ Angstroms and $C = 5.0$ Angstroms), and to have the properties: hardness, approximately 5.5 Mohs; thermal expansion coefficient, $5.56 \times 10^{-6}$ in the [001] direction; and density, 2.99. As in Example 1, all these properties are in excellent agreement with the available published data, which is shown in the Table.

The properties of the crystals grown using the method of the present invention indicate the suitability of melt-grown monocrystalline silicates for use as substrates for epitaxial film-substrate composites. For example, the low thermal expansion coefficient of $5.0 \times 10^{-6}$ (mullite) and $5.56 \times 10^{-6}$ (akermanite) indicate that they are more compatible with silicon ($3.9 \times 10-6$) than sapphire ($9.03 \times 10^{-6}$). The thermal expansion data shown in the Table are also low, although these data are for polycrystalline silicates, and thus may not always be representative of monocrystalline properties.

Referring further to the Table, the silicon content of the silicates has beneficial effects for composites formed from silicon semiconductor films and silicate substrates. That is, auto-doping should be reduced, and the stability of the substrate during deposition should be improved, as should the interface adhesion between the film and substrate.

As an additional example of the compatibility of the silicates for use as substrates, cordierite ($Mg_2Al_4Si_5O_{18}$) has an average coefficient of thermal expansion that closely approximates that of silicon; is resistant to thermal shock; and contains a significant concentration of silicon, thereby providing an expected reduced auto-doping and enhanced adhesion and substrate stability.

Figure 2:
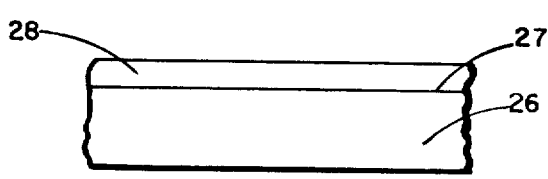
FIG. 2 is a cross-sectional representation of a composite comprising an epitaxial film on a single crystal silicate substrate grown in accordance with the present invention.

Thus, there are grown monocrystalline silicate crystals that have excellent substrate properties. These crystals can be cut or otherwise prepared for the epitaxial growth of semiconductor films thereon. The semiconductor films can then be grown on the silicate substrates using conventional techniques, such as chemical vapor deposition, to produce composite structures or devices. For example, and referring to FIG. 2, a monocrystalline mullite crystal 18 (FIG. 1) was grown in accordance with the present invention and was then cut and polished, using conventional techniques, to form a substrate wafer 26 having an (001) deposition surface 27. Then, an epitaxial (111) silicon film 28 was grown on the deposition surface 27 to a thickness of about 2 μm using pyrolysis of silane in a hydrogen atmosphere and a substrate temperature of about 1000° C. Of course, it will be understood by those skilled in the art that, regarding silicon-on-mullite orientations, the invention is not limited to {111} silicon on (001) or (00$\bar{1}$) mullite, but also applies to orientations such as {100} or {110} silicon on {100}, {010}, or {110} mullite.

Thus, there has been described a method of growing single crystal silicates from the melt, and usage for the silicates in composites of epitaxial films and substrates. Exemplary compositions, temperatures, times and other parameters for applying the method of the present invention have been given. However, the invention is limited only by the claims appended hereto and equivalents thereof.

Having thus described a preferred embodiment of the invention, what is claimed is:

1. A composite comprising a substrate formed of a monocrystalline silicate material selected from akermanite and mullite and a film of monocrystalline semiconductor material epitaxially disposed on said substrate.

2. The composite recited in claim 1 wherein said silicate is akermanite.

3. The composite recited in claim 2 wherein said film of monocrystalline semiconductor material is silicon.

4. The composite recited in claim 1 wherein said silicate is mullite.

5. The composite recited in claim 4 wherein said film of monocrystalline semiconductor material is silicon.

6. The composite recited in claim 5 wherein said film of monocrystalline silicon is disposed on a surface of the mullite having a {001} crystallographic orientation; and
said monocrystalline silicon has a {111} crystallographic plane parallel to the {001} crystallographic plane of the substrate surface on which said silicon is disposed.

* * * * *